(12) United States Patent
Gedamu et al.

(10) Patent No.: US 6,975,945 B2
(45) Date of Patent: Dec. 13, 2005

(54) SYSTEM AND METHOD FOR INDICATION OF FUSE DEFECTS BASED UPON ANALYSIS OF FUSE TEST DATA

(75) Inventors: Elias Gedamu, Calgary (CA); Denise Man, Fort Collins, CO (US)

(73) Assignee: Hewlett Packard Development Company, L.P., Houston, TX (US)

(*) Notice: Subject to any disclaimer, the term of this patent is extended or adjusted under 35 U.S.C. 154(b) by 114 days.

(21) Appl. No.: 10/649,404

(22) Filed: Aug. 26, 2003

(65) Prior Publication Data

US 2005/0049811 A1    Mar. 3, 2005

(51) Int. Cl.[7] ............................ G01R 31/00; G01B 5/28
(52) U.S. Cl. ............................ 702/59; 702/35; 702/36
(58) Field of Search ........................... 702/59, 35, 58, 702/117, 121, 36; 438/132; 257/529, 209, 257/528

(56) References Cited

U.S. PATENT DOCUMENTS

| | | | |
|---|---|---|---|
| 5,394,369 A * | 2/1995 | Kagami | 365/200 |
| 5,835,431 A | 11/1998 | Miner et al. | 365/201 |
| 5,933,376 A | 8/1999 | Lee | 365/200 |
| 6,008,523 A | 12/1999 | Narayan et al. | 257/529 |
| 6,119,251 A | 9/2000 | Cloud et al. | 714/718 |
| 6,266,792 B1 | 7/2001 | Wada et al. | 714/718 |
| 6,408,401 B1 | 6/2002 | Bhavsar et al. | 714/7 |
| 6,477,095 B2 | 11/2002 | White et al. | 365/201 |
| 6,479,310 B1 | 11/2002 | Paterno | 438/17 |
| 6,578,157 B1 | 6/2003 | Weber et al. | 714/8 |
| 6,701,003 B1 * | 3/2004 | Feinstein | 382/147 |
| 2002/0085439 A1 | 7/2002 | White et al. | 365/201 |
| 2002/0133770 A1 | 9/2002 | Cowles et al. | 714/723 |
| 2004/0140835 A1 * | 7/2004 | Lehmann et al. | 327/208 |

* cited by examiner

Primary Examiner—Bryan Bui
Assistant Examiner—Meagan S Walling (57) ABSTRACT

One embodiment of a method comprises retrieving test data corresponding to test results from a plurality of fuses, each one of the plurality of fuses residing on a different one of a plurality of semiconductor devices and each one of the plurality of fuses having a common location on the semiconductor devices, determining from the test data which of the plurality of fuses are defective fuses, and specifying on an output report the common location of the determined defective fuses when a number of the defective fuses are at least equal to a predefined portion of the plurality of fuses.

21 Claims, 5 Drawing Sheets

SYSTEM AND METHOD FOR INDICATION OF FUSE DEFECTS BASED UPON ANALYSIS OF FUSE TEST DATA

BACKGROUND

Figure 1:
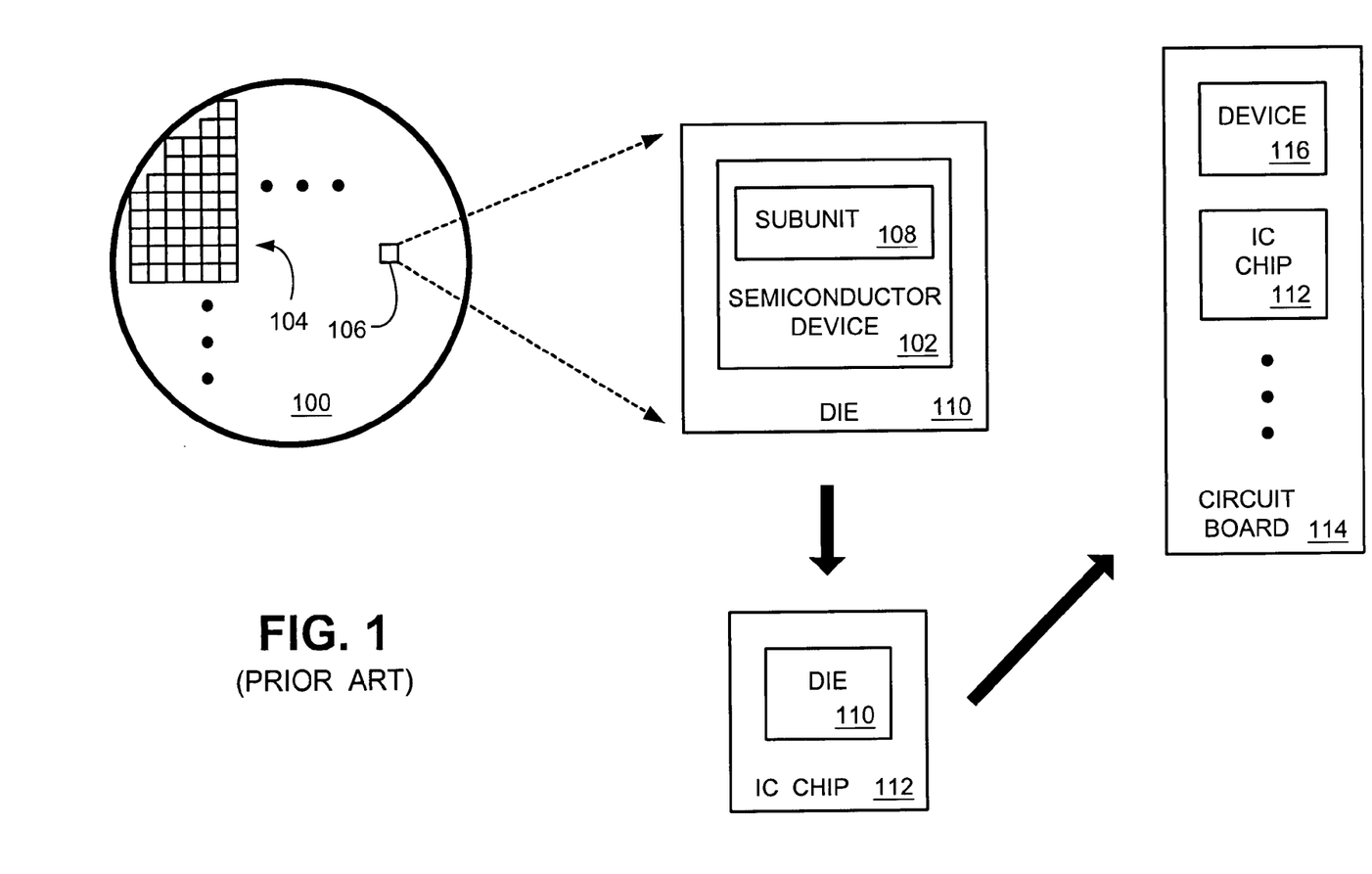
FIG. 1 is a simplified exemplary diagram of a fabricated wafer having a plurality of semiconductor devices occupying regions of the wafer.

FIG. 1 is a simplified exemplary diagram of a fabricated wafer 100 having a plurality of semiconductor devices 102 occupying regions 104 of the wafer 100. That is, a single semiconductor device 102 can be found in region 106 of the wafer 100. Typically, semiconductor devices 102 in regions 104 are designed as identical units, thereby facilitating mass production of many semiconductor devices.

After fabrication of wafer 100, a variety of testing may be done on the wafer to identify semiconductor devices 102 that are defective. Such testing may be of a "non-contact" nature. For example, incident light may be used to identify manufacturing defects such as thin or thick areas indicating out-of-tolerance regions on the wafer 100.

Or, testing may be of a "contact" nature wherein a probe device (not shown) is coupled to one or more semiconductor devices 102 on wafer 100. Probe contacts are in frictional contact with terminals of a tested semiconductor device 102, referred to as a device under test (DUT), so that a variety of electrical signals are applied to the DUT semiconductor device 102. Output signals from the DUT semiconductor device 102 are then analyzed and compared with expected designed output signals. Defective semiconductor devices 102 are identified when the test output signals do not correspond with the expected designed output signals.

Probe devices have been designed to test individual semiconductor devices 102. Other probe devices are designed to simultaneously test many semiconductor devices. For example, functionality of a processing unit may be verified by applying a test signal pattern and comparing the output of the processing unit with expected designed output signals.

After testing of wafer 100, the individual semiconductor devices 102 are separated from each other, referred to as singulation. The resultant individual semiconductor device 102 residing on a portion of the wafer is referred to as a die 110. Dies 110 passing the wafer testing process are then mounted on a substrate and encapsulated with a protective cover, this assembly is referred to as an integrated circuit (IC) chip 112. It is understood that the IC chip 112 having an encapsulated semiconductor device 102 may have a plurality of discrete subunits 108. For example, an IC chip 112 may include a processing unit and one or more associated memories, or may be a single unit, such as a memory device.

Typically, a "burn-in" process is used to identify IC chips 112 that would otherwise likely fail after a short period of use. Burn-in processes may vary, but generally consist of operating the IC chip 112 while the IC chip 112 is heated to temperatures above expected normal operating conditions. In some burn-in processes, further testing may occur. Accordingly, a variety of electrical signals are applied to the IC chip 112. Output signals are then analyzed and compared with expected designed output signals. Defective IC chips 112 are identified when the test output signals do not correspond with the expected designed output signals.

The IC chips 112 may be further tested after completion of the burn-in process. Such testing may be very sophisticated and complex, providing a thorough test to ensure that all subunits 108 of the IC chip 112 are properly functioning. Those IC chips 112 passing final testing are then attached to a circuit board 114 with other devices 116.

Detected output signals may be processed and saved as test output data during the above-described testing wherein electronic input signals are applied to the semiconductor device 102, to the IC chip 112, or to discrete subunits 108. The saved test data may be archived for later analysis.

SUMMARY

A system and method indicating semiconductor device fuse defects is disclosed. Briefly described, one embodiment comprises retrieving test data corresponding to test results from a plurality of fuses, each one of the plurality of fuses residing on a different one of a plurality of semiconductor devices and each one of the plurality of fuses having a common location on the semiconductor devices, determining from the test data which of the plurality of fuses are defective fuses, and specifying on an output report the common location of the determined defective fuses when a number of the defective fuses are at least equal to a pre-defined portion of the plurality of fuses.

Another embodiment comprises test data corresponding to testing of a plurality of fuses, each one of the plurality of fuses residing on a different one of a plurality of semiconductor devices and each one of the plurality of fuses having a common location on the semiconductor devices; and a memory with logic configured to determine from the test data which of the plurality of fuses are defective fuses, and further configured to specify on an output report the common location of the determined defective fuses when a number of the defective fuses are at least equal to a pre-defined portion of the plurality of fuses.

BRIEF DESCRIPTION OF THE DRAWINGS

The components in the drawings are not necessarily to scale relative to each other. Like reference numerals designate corresponding parts throughout the several views.

DETAILED DESCRIPTION

The fuse test data analysis system 300 (FIG. 3) is generally related to semiconductor device testing and, more particularly, is related to a system and method for indicating fuse defects based upon analysis of fuse test data. The fuse test data analysis system 300 analyzes fuse test data from a plurality of fuse arrays 206, 208 (FIG. 2), single fuses or other groupings of fuses to identify defective fuses. An output report 402 (FIG. 4) indicates defective fuses similarly located on a plurality of like semiconductor devices 102 (FIG. 2).

Figure 2:
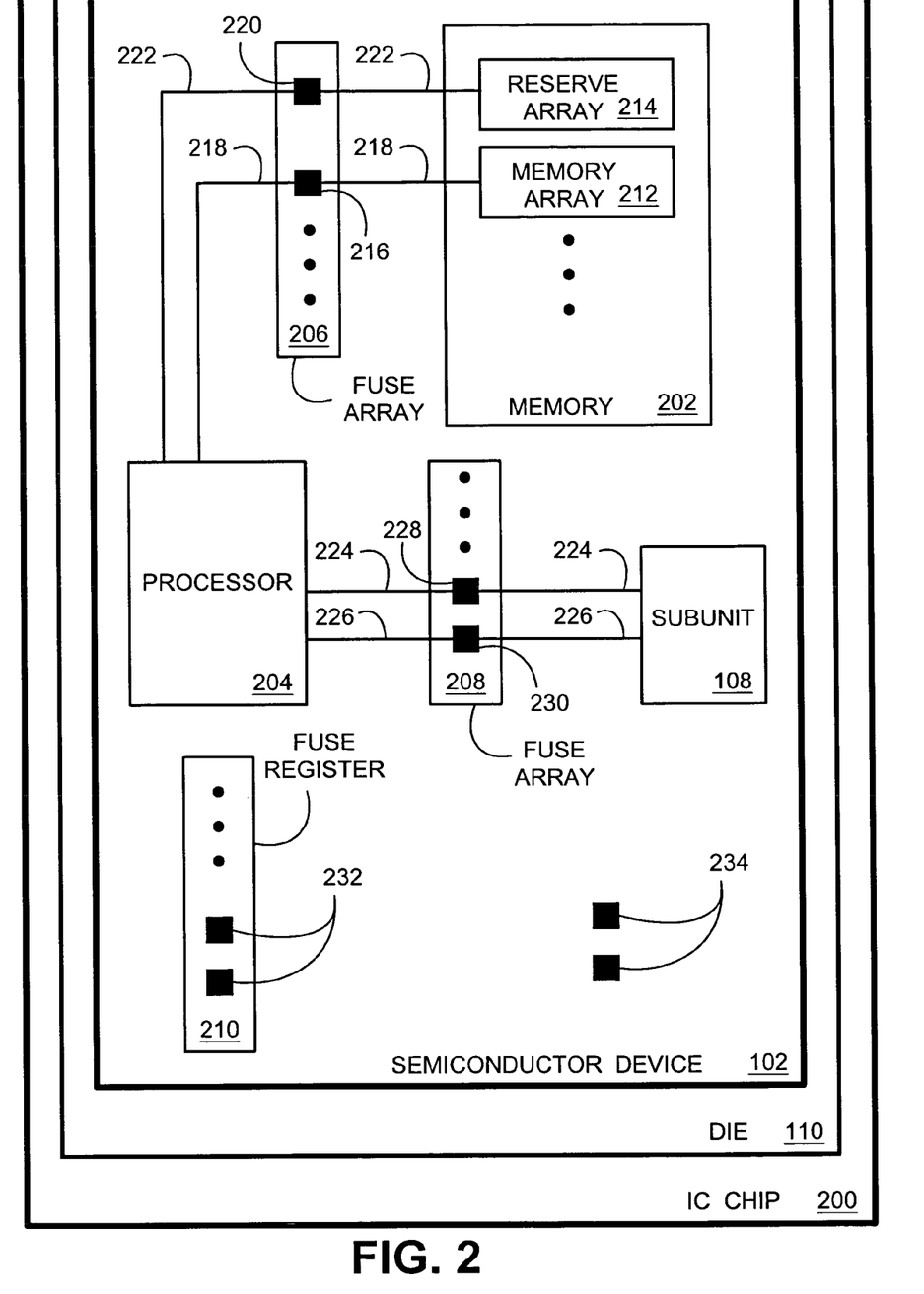
FIG. 2 is a simplified exemplary block diagram of a semiconductor device having a memory, a processor and at least one subunit.

FIG. 2 is a simplified exemplary block diagram of a semiconductor device 102 having a memory 202, a processor 204, at least one fuse array 206 and/or 208, and at least one subunit 108. Some embodiments of semiconductor device 102 include at least one fuse register 210. Memory 202 comprises a plurality of memory arrays 212 and at least one reserve array 214.

Memory 202 may be a region of semiconductor device 102 configured to store data that may later be retrieved by processor 204. Some types of memory 202 may be very large and configured to store large amounts of data. One exemplary large memory is a random access memory (RAM). Alternatively, memory 202 may be relatively small to provide quick convenient access by processor 204, such as a cache memory. Furthermore, semiconductor device 102 may have a plurality of memories 202.

Memory 202 may be a volatile memory device configured to store data as required by processor 204. Arrays 212 and 214 are predefined regions of the memory 202. Arrays 212 and 214 improve operational efficiency of processor 204 since the arrays 212 and 214 have predefined locations on the memory 202, thereby enabling the use of pointers or the like by logic executed by processor 204 to identify precisely where data has been stored into memory 202. Thus, pointers facilitate quicker storage and/or access of data that is saved into arrays 212 and 214.

During fabrication of semiconductor device 102, at least one reserve array 214 may be provided in the event that one or more of the memory arrays 212 are defective (not properly fabricated). During various stages of the fabrication process, the memory arrays 212 are tested to determine if the memory arrays 212 are properly working, and thus were properly fabricated. Accordingly, individual storage elements of arrays 212 and 214 are tested to ensure that data can be saved into and retrieved from each fuse array 206. In the event that one of the memory arrays 212 are defective, reserve array 214 may be used as a replacement.

Fuse array 206 provides selective connectivity between processor 204 and the memory arrays 212 and reserve arrays 214. Fuse array 206 comprises a plurality of fuse elements, fuses 216 and 220, to provide this connectivity. When fabricated, the fuses 216 and 220 are conductive. However, fuses 216 and 220 may be "blown" such that the fuses 216 and 220 are no longer conductive. Some types of fuses 216 and 220 are configured to be blown when a relatively large current is passed through the fuse such that the thermal energy, caused by power dissipated in the fuse, causes melting such that an open circuit condition within the fuse results. Other types of fuses are configured to be blown when a laser or other energy beam is incident upon the fuse.

In the event that memory array 212 is tested as a properly functioning memory array, fuse 216 remains in a conductive state such that the memory 202 can communicate with processor 204 via connection 218. In the event that testing determines that memory array 212 is defective, the fuse 216 may be intentionally blown, thereby deactivating the memory array 212 so that it cannot be used. The semiconductor device 102 may be then configured to recognize that reserve array 214 (assuming it tests as a properly functioning memory array) is a replacement for the defective memory array 212. Accordingly, fuse 220 remains in a conductive state such that the reserve array 214 communicates with processor 204 via connection 222. In the event that all memory arrays 212 are properly functioning, then the reserve array 214 is not required. Accordingly, fuse 220 may be intentionally blown to deactivate reserve array 214.

Similarly, processor 204 may be configured with some redundant internal portions (not shown). As a simplified illustrative example, processor 204 may be configured to communicate with subunit 108, via connections 224 or 226. Thus, a first internal portion of processor 204 may be coupled to connection 224 and a redundant internal portion may be coupled to connection 226. If the first internal portion of processor 204 tests as properly communicating with subunit 108, the fuse 228 remains in a conductive state. However, if the first internal portion of processor 204 is defective, fuse 228 may be blown, thereby isolating the defective first internal portion from subunit 108. Fuse 230 remains conductive such that the redundant internal portion of processor 204 is in communication with subunit 108 via connection 226 and fuse 230. However, in the event that the first internal portion of processor 204 initially communicates as designed with subunit 108, fuse 230 may be blown since the redundancy provided over connection 226 is not required.

Some types of semiconductor devices employ fuse register 210 to permanently store information of interest. For example, the serial number or other identifying information of the semiconductor device 102, or the device in which semiconductor device 102 is to be used in, may be saved into fuse register 210 by selectively blowing the plurality of fuses 232. Data indicating the status of fuses within fuse arrays 206 and/or 208, or information relating to the functioning of processor 204, memory 202 and/or subunit 108, may be saved into fuse register 210.

Single fuses 234 may also be used in various locations on semiconductor device 102 for selectively enabling communication through the fuses 234. It is understood that the above simplified description of the use of fuses 216, 220, 228, 230, 232 and 234 are intended to illustrate some of the uses of a fuse in a semiconductor device 102. Furthermore, fuses may be grouped in an array such as arrays 206 or 208, may be grouped in another manner, or may be dispersed through the semiconductor device 102 in accordance with the design of the semiconductor device. Also, the processor 204, memory 202 and/or subunit 108 were provided as illustrative components. Other semiconductor devices may not include one or more of the above-described components. For example, the semiconductor device 102 may have only memory 202 (and corresponding fuses to selectively enable portions of the memory).

Figure 3:
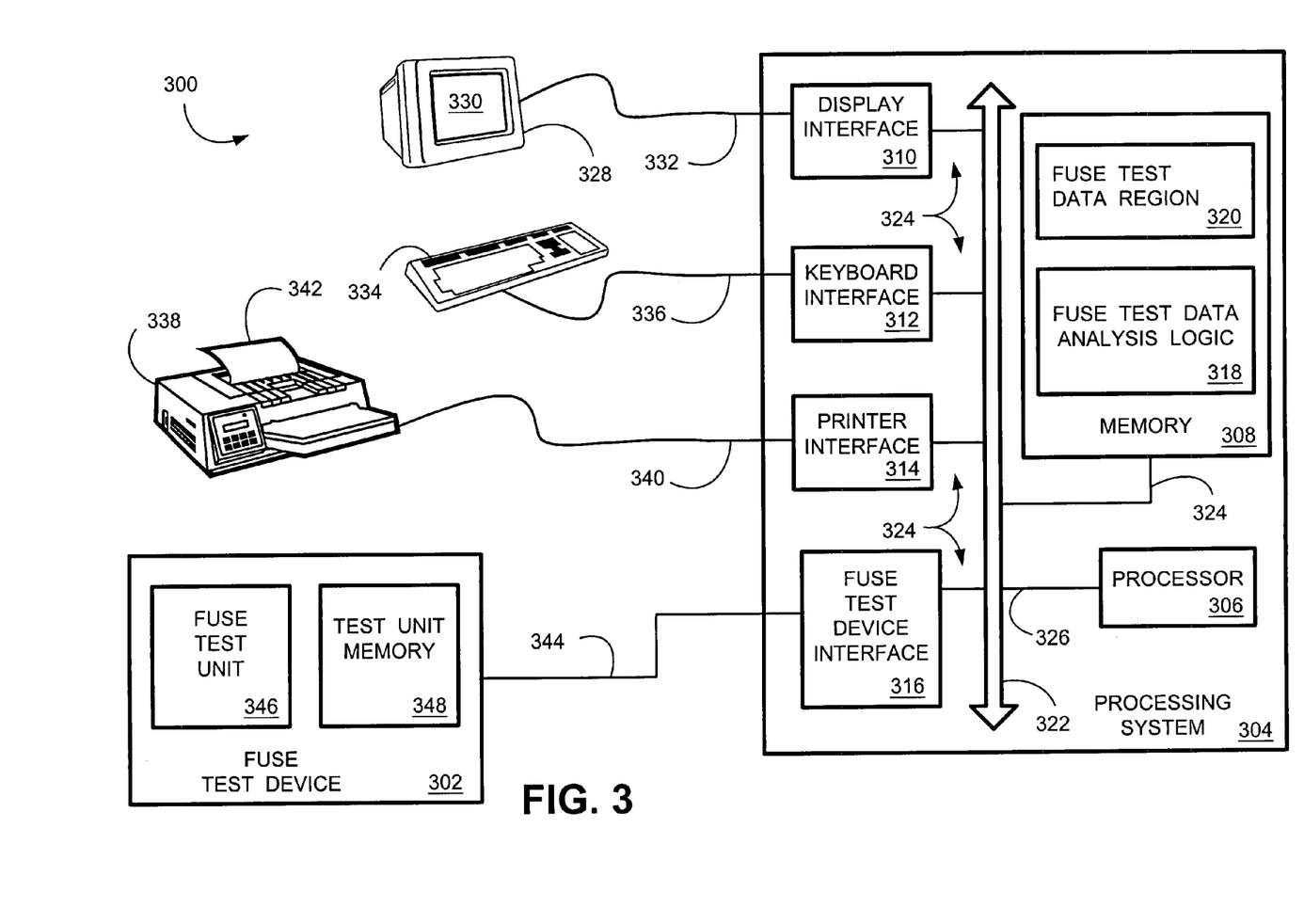
FIG. 3 is a simplified exemplary block diagram of a fuse test data analysis system coupled to a fuse test device.

FIG. 3 is a simplified exemplary block diagram of a fuse test data analysis system 300 coupled to a fuse test device 302. One embodiment of fuse test data analysis system 300 is a processing system 304 comprising a processor 306, a memory 308, display interface 310, keyboard interface 312, printer interface 314 and fuse test device interface 316. Memory 308 further includes a fuse test data region 318 and a fuse test data analysis logic 320.

Memory 308, display interface 310, keyboard interface 312, printer interface 314, and fuse test device interface 316 are coupled to communication bus 322 via connections 324. Communication bus 322 may be coupled to processor 306 via connection 326, thereby providing connectivity to the above-described components. In alternative embodiments of processing system 304, the above-described components are connectivley coupled to processor 306 in a different manner than illustrated in FIG. 3. For example, one or more of the above-described components may be directly coupled to processor 306 or may be coupled to processor 306 via intermediary components (not shown).

The above-described interfaces 310, 312, 314 and 316 are configured to exchange information from processing system 304 and their respective connected device. For example, display interface 310 may be configured to interface between processing system 304 and display device 328 such that output report 402 (FIG. 4) is displayed on display 330.

Keyboard interface 312 is configured to receive operating instructions from a keyboard 334, via connection 336. Printer interface 314 is configured to communicate graphics data from processing system 306 to printer 338, via connection 340, such that output report 402 (FIG. 4) may be printed on printer 338. Fuse test device interface 316 is configured to receive test data corresponding to fuse tests, via connection 344.

For convenience, connections 332, 336, 340 and 344 are illustrated as hardwire connections. Any one of the connections 332, 336, 340 and/or 344 may be implemented with other suitable media, such as infrared, optical, wireless or the like. In other embodiments, the interfaces 310, 312, 314 and 316 are implemented as part of another component residing in processing system 304, such as part of processor 306.

Fuse test device 302 includes a fuse test unit 346 configured to test fuses residing on semiconductor device 102 (FIG. 2). The test data resulting from fuse testing may be stored in test unit memory 348. Alternatively, the test data may be communicated directly to the fuse test data region 320 of memory 308. Any suitable fuse test device 302 may be used for testing fuses. For example, a device configured to perform bit checking and/or bit flipping may be used to test fuses.

The resultant test data associated with testing fuses may be relatively large and complex. The amount of test data is dependent upon the number of tested fuses in a semiconductor device 102. Furthermore, the amount of test data may be dependent upon the number of devices under test (DUTs). For example, all dies from a single wafer 100 (FIG. 1) may be tested to determine if the fuses are properly functioning. In that event, many hundreds of fuses may be tested. If all dies from a plurality of like wafers 100 are tested, even more fuses would be tested. The plurality of like wafers 100 may be from one or more production runs, or may be produced during a time period of interest.

Fuse testing may be done before singulation of wafer 100 (before dies 110 are cut from the wafer 100). Or, testing of fuses may be done while the die 110 is on the IC chip 112 (FIG. 1). Or, fuse testing may be done while the IC chip 112 in on the circuit board 114. It is understood that testing of fuses, and the saving of the resultant test data, may be done at any convenient time during the fabrication process and may be done with any suitable testing device now known or later developed.

As noted above, the saved resultant test data, determined by analyzing the fuse test data and which corresponds to a particular set of tested fuses, may comprise a very large amount of information. This large amount of information may be very unwieldy and difficult to process. If manually processed, the information may be difficult to understand and interpret.

Additionally, other associated information may be included in the fuse test data. For example, associated information includes identification of the DUT, and/or identification of, or portions of, fuse array 206, fuse array 208, fuse register 232 (FIG. 2) and/or other groups of fuses. And, identifiers of the DUT and/or location of the DUT on a wafer 100 (FIG. 1) may be included in the fuse test data. Furthermore, an identifier may be included in the fuse test data which identifies the wafer 100 which the die 110 came from (or an identifier identifying dies originating from a common wafer), the fabrication date, the fabrication run, the fabrication machine and/or other information of interest.

Figure 4:
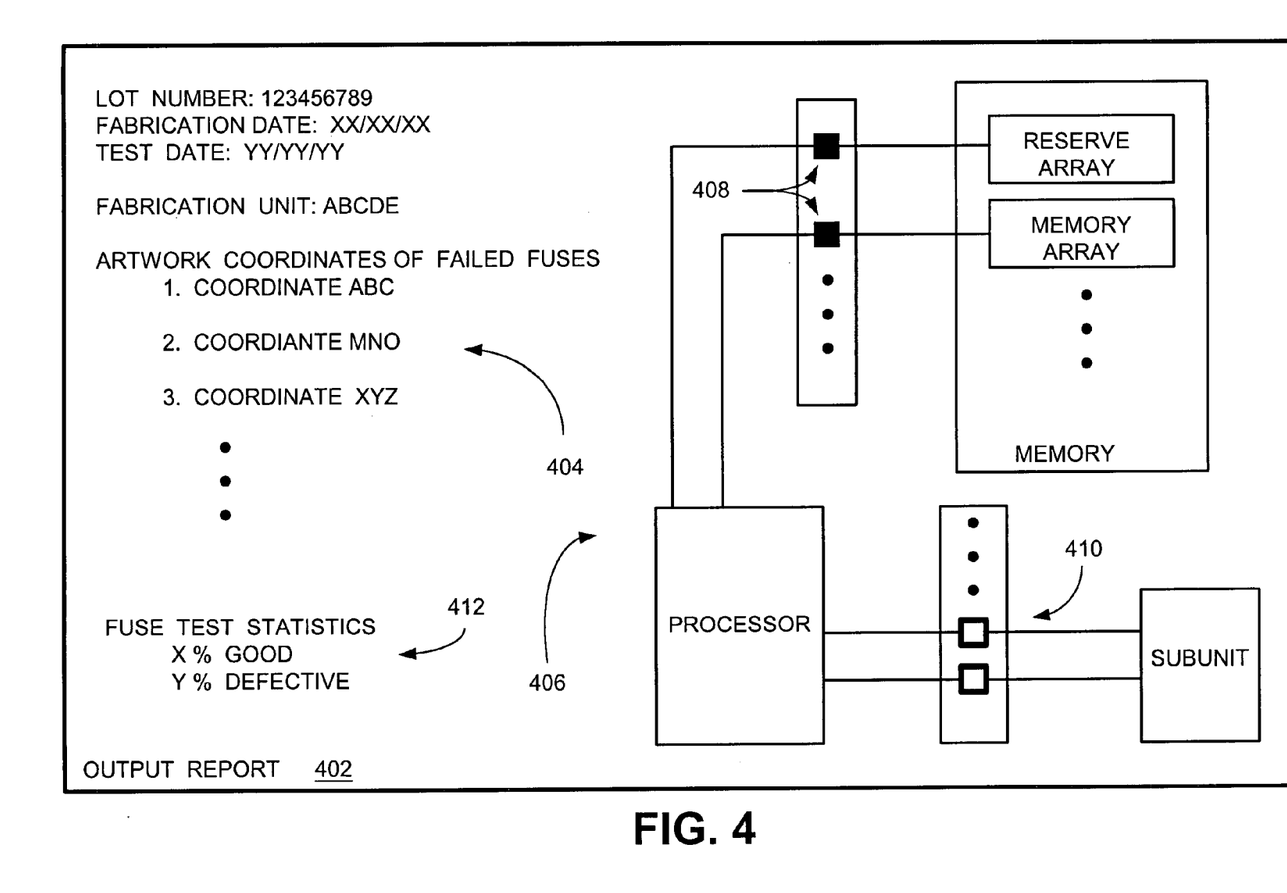
FIG. 4 is an illustrative output report prepared by embodiments of the fuse test data analysis system.

Embodiments of the fuse test data analysis system 300 are configured to process the test information into information that is readily understandable to a person. For example, on a plurality of semiconductors configured as illustrated in FIG. 2, fuses 216 and 220 may be tested as defective on all or many of the semiconductor devices 102. When the fuses 216 and 220 fail at an unexpected rate, the failure may be reported on output report 402 (FIG. 4). Thus, during testing of the memory array 212 and the reserve array 214, a detected failure of these arrays 212 and/or 214 may be attributed to the defective fuses 216 and/or 220, respectively, rather than attributed to a defective portion of the arrays themselves. Furthermore, a consistency in fuse failures may indicate a design deficiency and/or of problems occurring during the fabrication process for the plurality of semiconductor devices.

FIG. 4 is an illustrative output report 402 prepared by embodiments of the fuse test data analysis system 300 (FIG. 3). Based upon test results identifying acceptable and/or defective fuses, one embodiment prints artwork coordinates 404 of failed fuses. For example, if the fuses 216 and/or 220 fail at an unexpectedly high rate in a plurality of semiconductor devices, the artwork coordinates 404 of the failed fuses 216 and/or 220 are provided on output report 402. Other embodiments indicate other suitable identifiers of the failed fuses 216 and/or 220, such as a die location.

In one embodiment, artwork 406 may be included on the output report 402. Artwork 406 may be any suitable graphical representation of a semiconductor device, or a portion thereof. As a simplified illustrative example, a portion of semiconductor device 102 is illustrated. Failed fuses are highlighted with a suitable indicia, shown as black squares 408 for convenience. Acceptable fuses may be highlighted with another suitable indicia, shown as white squares 410 for convenience. Or, groups of fuses may be indicated by using a suitable indicia for a fuse array, fuse register or other grouping of fuses. Thus, a viewer of output report 402 can determine where defective fabrication of fuses is occurring on a semiconductor device, or on a portion thereof.

It is understood that any suitable symbology and/or nomenclature may be used to identify defective (or acceptable) fuses on artwork 406. Colored squares may be used to designate fuses. Or, a numeral, letter or other symbol may be used to designate fuses. Accordingly, a viewer of the artwork 406 can readily and quickly identify location of defective fuses on a plurality of semiconductor devices.

The above-described fuse test data indicates performance of individual fuses. When a plurality of fuses are tested, the resultant test information may be stored in test memory unit 348, or accumulated in a register or the like. A characteristic signature corresponding to the stored test data can be compared with signatures of other tested DUTs.

Accordingly, fuse test data associated with fuses 206 of a plurality of DUTs may be analyzed statistically. For example, characteristic signatures from a plurality of similar DUTs may be compared. As an illustrative example, the artwork 406 may be configured to display only those fuses having acceptable and/or defective fuses where a predefined number or percentage of semiconductor devices exhibit similar fuse test performance. To illustrate, assume the user has specified a statistical threshold of 80 percent (80%) for identification of commonly located defective fuses in a group of like semiconductor devices. For a group of semiconductor devices, a black square 408 may be displayed only when 80% or more of the commonly tested fuses are defective. Furthermore, a white square 410 may be displayed only when 80% or more of the commonly located dies 110 exhibit acceptable fuse test results. It is understood that any suitable statistically based threshold may be specified. The output report 402 may further include statistical information of interest in a textual format 412.

Output report 402 may further include other information of interest in a textual format. For example, the lot number of a group of wafers having tested fuses may be indicated. Fabrication and/or testing dates may also be included. Fabrication machine and/or fabrication plant location information may be indicated.

Output report 402 is determined from analysis of fuse test data described above. The fuse test data may reside in test unit memory 348 and/or in the fuse test data region of memory 308. When a user desires to view an output report 402, the user causes processor 306 to retrieve and execute fuse test data analysis logic 318 (FIG. 3). Processor 306 retrieves the fuse test data and generates a fuse analysis data file that is used to construct the output report 402.

The constructed fuse analysis data file may be saved for further analysis or reference at a later time. The fuse analysis data file may be saved into a suitable region of memory 308, or saved to another suitable memory.

Figure 5:
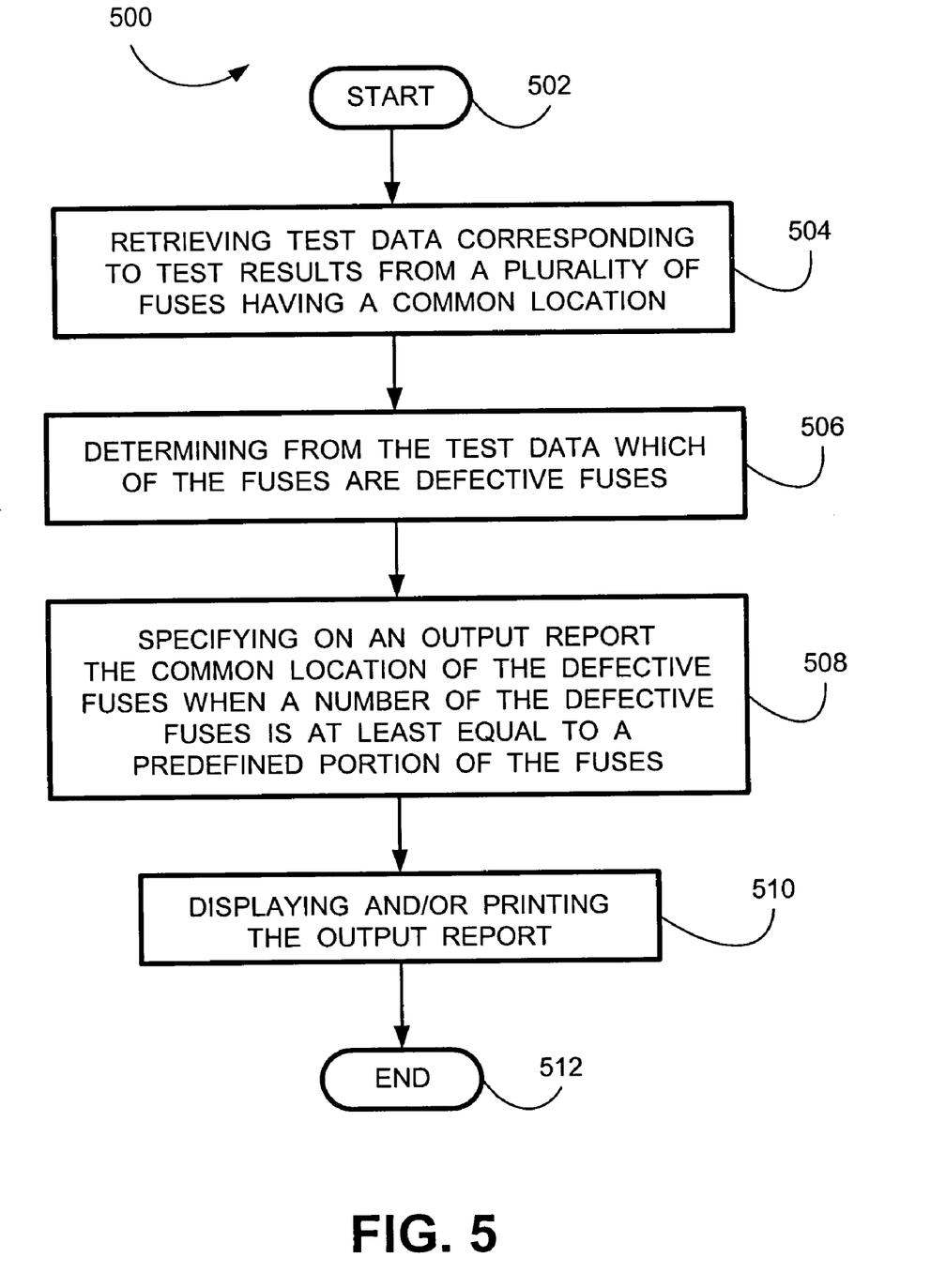
FIG. 5 shows a flow chart illustrating a process for an embodiment of the fuse test data analysis system.

FIG. 5 shows a flow chart 500 illustrating a process for an embodiment of the fuse test data analysis system 300 (FIG. 3). The flow chart 500 shows the architecture, functionality, and operation of an embodiment for implementing the fuse test data analysis logic 318 such that test data from a plurality of tested fuses 206 (FIG. 2) are analyzed. An alternative embodiment implements the logic of flow chart 500 with hardware configured as a state machine. In this regard, each block may represent a module, segment or portion of code, which comprises one or more executable instructions for implementing the specified logical function (s). It should also be noted that in some alternative implementations, the functions noted in the blocks may occur out of the order noted in FIG. 5, or may include additional functions. For example, two blocks shown in succession in FIG. 5 may in fact be substantially executed concurrently, the blocks may sometimes be executed in the reverse order, or some of the blocks may not be executed in all instances, depending upon the functionality involved, as will be further clarified hereinbelow. All such modifications and variations are intended to be included herein.

The process begins at block 502. At block 504, test data corresponding to test results from a plurality of fuses is retrieved, each one of the plurality of fuses residing on one of a plurality of semiconductor devices and each one of the plurality of fuses having a common location on the semiconductor devices. Accordingly, when fuses commonly located on a plurality of DUTs are tested, the corresponding test data for those commonly located fuses is retrieved.

At block 506, based upon the test data, defective fuses are determined from the plurality of commonly located fuses. At block 508, the common location of the determined defective fuses are specified on an output report when a number of the defective fuses are at least equal to a predefined portion, percentage, or the like, of the plurality of commonly located fuses. At block 510, the output report is displayed and/or printed. The process ends at block 512.

When the above-described process is repeated for many fuses on a plurality of DUTs, and the locations of defective fuses are specified on the output report, fabrication defects can be determined because a high percentage of defective fuses correlates to problems in the fabrication process. The fuse testing can be performed on individual fuses, on fuses in a fuse array, on fuses in a fuse register, and/or on other groupings of fuses.

Embodiments implemented in memory 308 (FIG. 3) may be implemented using any suitable computer-readable medium. In the context of this specification, a "computer-readable medium" can be any means that can store, communicate, propagate, or transport the data associated with, used by or in connection with the instruction execution system, apparatus, and/or device. The computer-readable medium can be, for example, but not limited to, an electronic, magnetic, optical, electromagnetic, infrared, or semiconductor system, apparatus, device, or propagation medium now known or later developed.

For convenience, the embodiment of fuse test data analysis system 300 (FIG. 3) is illustrated as residing in processing system 304. Processing system 304 may be any suitable processing system, such as, but not limited to, a work station, a mainframe computer, a personal computer, a laptop computer or a special purpose processing device. Furthermore, other embodiments of a fuse test data analysis system may be implemented as an integral part of a fuse test device or another testing system that may be configured to test fuses. Such testing devices may also be configured to test other components of a wafer(s), die(s), IC chip(s) and/or circuit board(s).

The output report 402 (FIG. 4) is illustrated as a graphically based report that may be viewable on a display or that may be printable in hardcopy form. Accordingly, some embodiments of the fuse test data analysis logic include logic configured to generate graphical output files suitable for display and/or printing. For example, one displayable format may be a graphical description file (gdf). It is understood that any suitable output format for displaying and/or printing a graphical output file may be used by embodiments of a fuse test data analysis system 300.

It should be emphasized that the above-described embodiments are merely examples of implementations. Many variations and modifications may be made to the above-described embodiments. All such modifications and variations are intended to be included herein within the scope of the following claims, unless excluded by express claim language.

What is claimed is:

1. A system which indicates semiconductor device fabrication defects comprising:
   test data corresponding to testing of a plurality of fuses, each one of the plurality of fuses residing on a different one of a plurality of semiconductor devices and each one of the plurality of fuses having a common location on the semiconductor devices; and
   a memory with logic configured to determine from the test data which of the plurality of fuses are defective fuses, and further configured to specify on an output report the common location of the determined defective fuses when a number of the defective fuses are at least equal to a predefined portion of the plurality of fuses.

2. The system of claim 1, further comprising a fuse test device configured to test the plurality of fuses.

3. The system of claim 2, wherein the fuse test device further comprises a fuse test unit configured to test the plurality of fuses when the semiconductor device resides on a wafer.

4. The system of claim 2, wherein the fuse test device further comprises a fuse test unit configured to test the plurality of fuses when the semiconductor device resides on a die.

5. The system of claim 2, wherein the fuse test device further comprises a fuse test unit configured to test the plurality of fuses when the semiconductor device resides on an integrated circuit chip.

6. The system of claim 2, wherein the fuse test device further comprises a fuse test unit configured to test the plurality of fuses when the semiconductor device resides on a circuit board.

7. A method for indicating semiconductor device fabrication defects, the method comprising:
   retrieving test data corresponding to test results from a plurality of fuses, each one of the plurality of fuses residing on a different one of a plurality of semiconductor devices and each one of the plurality of fuses having a common location on the semiconductor devices;
   determining from the test data which of the plurality of fuses are defective fuses; and
   specifying on an output report the common location of the determined defective fuses when a number of the defective fuses are at least equal to a predefined portion of the plurality of fuses.

8. The method of claim 7, further comprising specifying the predefined portion as a percentage.

9. The method of claim 7, further comprising:
   retrieving the test data corresponding to the test results from a plurality of second fuses, each one of the plurality of second fuses residing on a different one of the semiconductor devices and each one of the plurality of second fuses having a second common location on the semiconductor devices;
   determining from the test data which of the plurality of second fuses are defective second fuses; and
   specifying on the output report the second common location of the determined defective second fuses when a number of the defective second fuses are at least equal to the predefined portion of the plurality of second fuses.

10. The method of claim 7, further comprising:
    retrieving the test data corresponding to the test results from a plurality of fuse arrays, each one of the fuse arrays having a plurality of array fuses and each one of the plurality of fuse arrays having a common fuse array location on the semiconductor devices;
    determining from the test data which of the plurality of array fuses are defective array fuses; and
    specifying on the output report the common fuse array location when a number of the defective array fuses are at least equal to a predefined portion of the array fuses.

11. The method of claim 7, further comprising:
    retrieving the test data corresponding to the test results from a plurality of fuse registers, each one of the fuse registers having a plurality of register fuses and each one of the plurality of fuse registers having a common fuse register location on the semiconductor devices;
    determining from the test data which of the plurality of register fuses are defective register fuses; and
    specifying on the output report the common fuse registers location when a number of the defective register fuses are at least equal to a predefined portion of the register fuses.

12. The method of claim 7, further comprising:
    retrieving the test data corresponding to the test results from a grouping of fuses, each one of the grouped fuses in the grouping of fuses having a common location on the semiconductor devices;
    determining from the test data which of the grouped fuses are defective; and
    specifying on the output report the common location when a number of the defective grouped fuses are at least equal to a predefined portion of the grouped fuses.

13. The method of claim 7, further comprising displaying the output report.

14. The method of claim 7, further comprising printing the output report.

15. The method of claim 7, further comprising testing the plurality of fuses.

16. A system for identifying semiconductor device fabrication defects, comprising:
    means for retrieving test data corresponding to test results from a plurality of fuses, each one of the plurality of fuses residing on a different one of a plurality of semiconductor devices and each one of the plurality of fuses having a common location on the semiconductor devices;
    means for determining from the test data which of the plurality of fuses are defective fuses;
    means for generating an output report the common location of the determined defective fuses when a number of the defective fuses are at least equal to a predefined portion of the plurality of fuses; and
    means for displaying the output report.

17. The system of claim 16, further comprising:
    means for retrieving the test data corresponding to the test results from a plurality of second fuses, each one of the plurality of second fuses residing on a different one of the semiconductor devices and each one of the plurality of second fuses having a second common location on the semiconductor devices;
    means for determining from the test data which of the plurality of second fuses are defective second fuses; and
    means for specifying on the output report the second common location of the determined defective second fuses when a number of the defective second fuses are at least equal to the predefined portion of the plurality of second fuses.

18. The system of claim 16, further comprising:
    means for retrieving the test data corresponding to the test results from a plurality of fuse arrays, each one of the fuse arrays having a plurality of array fuses and each one of the plurality of fuse arrays having a common fuse array location on the semiconductor devices;
    means for determining from the test data which of the plurality of array fuses are defective array fuses; and
    means for specifying on the output report the common fuse array location when a number of the defective array fuses are at least equal to a predefined portion of the array fuses.

19. The system of claim 16, further comprising:
    means for retrieving the test data corresponding to the test results from a plurality of fuse registers, each one of the fuse registers having a plurality of register fuses and each one of the plurality of fuse registers having a common fuse register location on the semiconductor devices;
    means for determining from the test data which of the plurality of register fuses are defective register fuses; and
    means for specifying on the output report the common fuse register location when a number of the defective register fuses are at least equal to a predefined portion of the register fuses.

20. The system of claim 16, further comprising:
    means for retrieving the test data corresponding to the test results from a grouping of fuses, each one of the grouped fuses in the grouping of fuses having a common location on the semiconductor devices;

means for determining from the test data which of the plurality of grouped fuses are defective; and means for specifying on the output report the common location when a number of the defective grouped fuses are at least equal to a predefined portion of the grouped fuses.

21. A computer-readable medium having a program for indicating semiconductor device fabrication defects, the program comprising logic configured to perform:

receiving from a memory test data corresponding to test results from a plurality of fuses, each one of the plurality of fuses residing on a different one of a plurality of semiconductor devices and each one of the plurality of fuses having a common location on the semiconductor devices;

determining from the test data which of the plurality of fuses are defective fuses; and specifying on an output report the common location of the determined defective fuses when a number of the defective fuses are at least equal to a predefined portion of the plurality of fuses.

* * * * *